United States Patent [19]

Burch

[11] Patent Number: 4,546,441
[45] Date of Patent: Oct. 8, 1985

[54] METHOD AND APPARATUS FOR TIME BASED MEASUREMENT OF IMPEDANCE

[76] Inventor: John Burch, 18519-64th Place N.E., Seattle, Wash. 98155

[21] Appl. No.: 400,911

[22] Filed: Jul. 22, 1982

[51] Int. Cl.[4] ............................................. G01R 27/00
[52] U.S. Cl. ................................. 364/482; 324/57 R; 324/62
[58] Field of Search ............. 364/481, 482; 324/57 R, 324/60 R, 59, 62; 340/347 NT; 343/458

[56] References Cited

U.S. PATENT DOCUMENTS

| | | | |
|---|---|---|---|
| 3,286,176 | 11/1966 | Birnboim | 364/481 |
| 3,906,486 | 9/1975 | Phillips | 340/347 NT |
| 4,041,494 | 8/1977 | Ewen et al. | 343/458 |
| 4,047,001 | 9/1977 | Witriol et al. | 364/481 |
| 4,196,475 | 4/1980 | Hall | 324/57 R |
| 4,242,631 | 12/1980 | Hall | 324/57 R |
| 4,268,820 | 5/1981 | Hareyama | 340/347 NT |
| 4,342,089 | 7/1982 | Hall | 324/57 R |
| 4,404,545 | 9/1983 | Nakanishi et al. | 340/347 NT |
| 4,409,543 | 10/1983 | Sugihara | 324/57 R |

FOREIGN PATENT DOCUMENTS 2017438  10/1979  United Kingdom ................ 364/481

OTHER PUBLICATIONS

Bell, Coster, and Smith, "A Computer Based, Four Terminal Impedance Measuring System for Low Frequencies", 1975, pp. 66–70, vol. 8, Journal of Physics E: Scientific Instruments.

Primary Examiner—Jerry Smith
Assistant Examiner—Louis Woo
Attorney, Agent, or Firm—Cole, Jensen & Puntigam

[57] ABSTRACT

Method and apparatus for time lapse based measurement of impedance wherein a series of time measurements are made by voltage transitions with respect to a reference voltage across an unknown component and across a reference component with a known impedance. The time measurements are fed to a microprocessor or other computer means for calculating the impedance of the unknown component.

7 Claims, 2 Drawing Figures

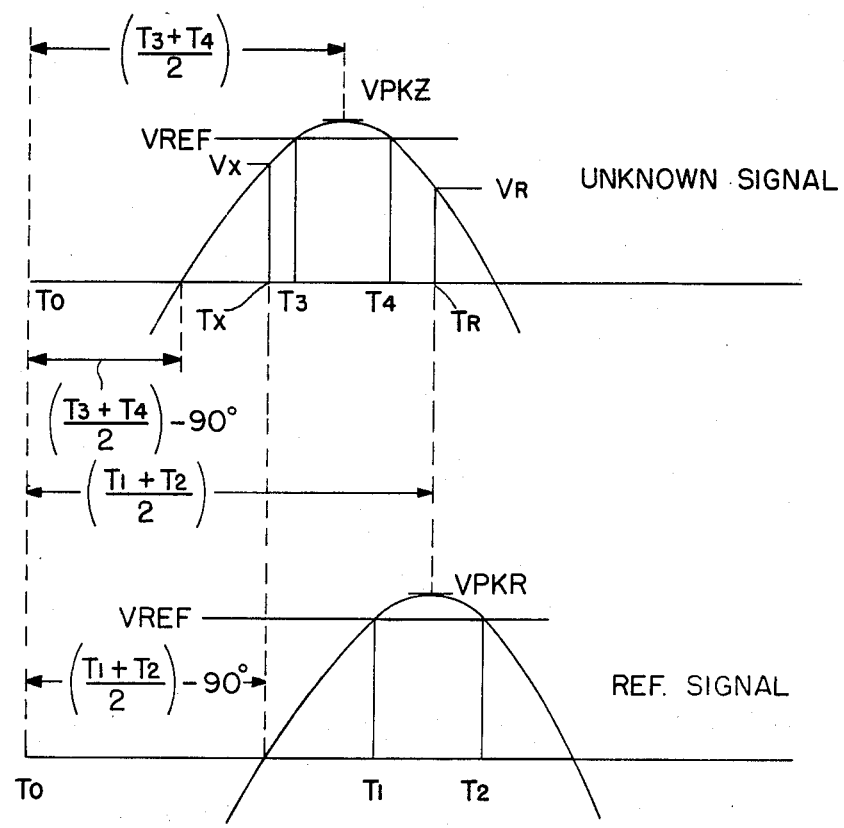

METHOD AND APPARATUS FOR TIME BASED MEASUREMENT OF IMPEDANCE

BACKGROUND OF THE INVENTION

The invention relates to a method and apparatus for automatic measurement of impedance and more particularly is directed to a time-lapse based method and apparatus for measuring the impedance of an unknown component.

Those skilled in the art are well aware that the prior art includes many means for measuring the impedance of circuit elements. One of the oldest and most classical methods of impedance measurement involves some form of AC Wheatstone or four-branch bridge circuit within which the unknown component in one of the arms or branches is compared to a standard component in another branch. A balance is obtained by adjusting ratio arms in the bridge until a null voltage is obtained at which time the unknown component reactance can be determined. As long ago as 1898, 27 different bridges were described for measuring impedance and other methods were later described. See H. Rowland, "Electrical Measurement by Alternating Currents", American Journal of Science, 4th series, Vol. 4, pp 429–448 (1897) and Phil. Mag. 5th series, Vol. 45, pp 66–85 (1898).

These older bridge methods all required considerable operator skill, especially when a large resistive component was associated with the reactive component, that is a low quality factor (Q) or a high dissipation factor (D). Difficulties were increased because two adjustments are needed to null the bridge and the two adjustments interact.

Other impedance measuring devices that do not use adjustable elements to obtain a balance are referred to as impedance meters. Some of these either keep the voltage across the unknown impedance constant or the current constant, so that the measured current or voltages are proportional to impedance or admittance with only one quantity requiring measurement. This in effect is division by a constant. Other meter type instruments measure voltage and current and obtain the ratio by analog division methods.

More recent methods employing electronic circuits compare the AC signals simultaneously developed across the series combination of the unknown component and a reference resistor. To obtain the appropriate vector component a phase-sensitive detector is employed, the average output of which is presented to an analog-to-digital converter for further digital processing by a microprocessor. The disadvantage of this method is the necessity for precisely maintaining the phase relationship between the test signal and the phase sensitive detector control signal. This problem has been solved as described in U.S. Pat. No. 4,196,475 to Hall but the described method still requires phase detecting and analog-to-digital conversion circuits which are slow in operation and unnecessarily complex.

The only prior art patent which would appear to have any bearing on the instant invention is U.S. Pat. No. 4,196,475 which utilizes a phase sensitive detector and an analog-to-digital converter and which uses voltage measurements rather than time-based voltage transitions.

SUMMARY OF THE INVENTION

Impedance measuring system in which an oscillator generates a desired frequency which is divided down. An unknown component Z is connected in series with a low inductance, low capacitance reference resistor (resistors) and the measurement signal applied across a combination. A high input impedance differential amplifier is alternately connected across the unknown and the selected reference resistor. The single ended output voltage of the amplifier is connected to one input of a high speed comparator. The other comparator input is connected to a fixed reference voltage. The reference voltage must be stable for the duration of a measurement cycle but its absolute value is not critical. The output of the comparator is fed to a timing circuit via a phase reversing circuit which allows the timing to be halted either on the positive going or negative going transition of the comparator output. Thus, time is measured from a fixed reference to the time the signal first crosses a threshold and a second time is measured from the same reference to the time the signal recrosses the threshold in the opposite direction. This procedure is performed for both the unknown signal and the reference signal.

Accordingly, it is among the features of the invention to provide an apparatus and method for measuring impedance which is based on time-domained measurements in terms of digital output or compatability with a microprocessor. The invention has no requirement for zero adjustment or compensation nor does it require a precise or highly stable reference voltage. Accuracy of the system is dependent on a single crystal control oscillator of known frequency together with several precision reference resistors. The time measurements are used in a computation performed by a microprocessor to generate the desired reading which may, if desired, be of inductance, capacitance, resistance, quality factor or dissipation factor. The system does not require zero adjustment, and it does not require analog-to-digital conversion nor does it require phase detecting. Accordingly, the results are obtained mathematically by inputting the time measurement digital-readout signals to a microprocessor or computer.

The system is simple and reliable and in fact greatly simplifies determination of impedance in an unknown component.

BRIEF DESCRIPTION OF DRAWINGS

FIG. 2 is a diagram further illustrating the time lapse measurements with respect to a reference or standard component and the unknown.

DESCRIPTION OF PREFERRED EMBODIMENT

Figure 1:
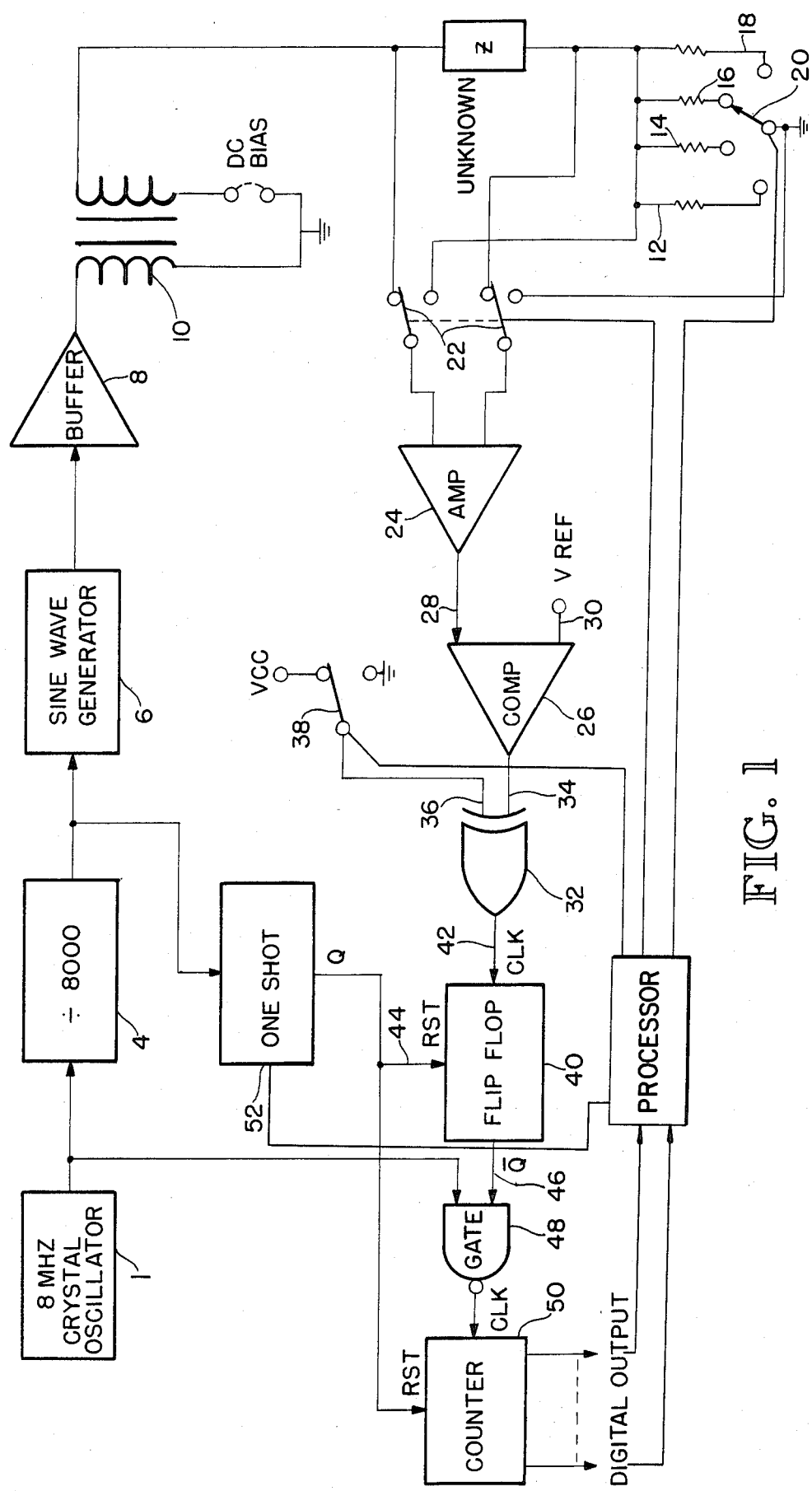
FIG. 1 is a block diagram showing the basic circuit components and elements.

Referring now to FIG. 1, it will be seen that a crystal controlled oscillator circuit 2 in this instance has an 8 MHZ frequency but which can also be any other convenient frequency. The output of oscillator 1 is divided by 8,000 in counter 4 in order to obtain a standard measurement frequency of 1 KHZ. The output of counter 4 is applied to a narrow pass band filter circuit 6 to generate a pure sine wave of the desired frequency from the square wave input. It will be appreciated that other means exist for obtaining a sine wave from the oscillator output including a digital filter or any high quality factor filter such as an ROM based sine wave generator.

The sine wave is transmitted via buffer amplifier 8 to produce a low impedance signal to be applied to the unknown component Z and one of the reference resistors to be described hereinafter. The low impedance signal may be coupled to the unknown Z and to the reference resistors via transformer 10 which, though not essential, eases application of DC voltage to the unknown Z. There is no wave distortion through the transformer which is useful in applying the DC bias voltage to the component being measured, the DC voltage being connected in series as shown with the secondary winding of transformer 10.

For purposes of illustration four reference resistors 12, 14, 16 and 18 are connected in series with the unknown Z such that the signal across one of the selected reference resistors is comparable in magnitude to the signal across unknown Z. Selection of the reference resistor is obtained by use of range switch 20 which can be manually operated based on a trial and error procedure or which can be automatically operated by the microprocessor.

As is commonly done in measurement systems, the reference resistors have values which are a factor of 10 greater than the previous resistance value and thus the number of decades of measurement range is determined by the number of reference resistors incorporated. The reference resistors are precision components with a zero or minimum reactive component associated with the resistive component. Additionally, they should have low temperature coefficients to insure system accuracy over a wide temperature range. The signals simultaneously developed across the unknown Z and the selected reference resistor are alternately connected to amplifier 24 by means of the microprocessor controlled double pole, double throw analog switch 22.

Amplifier 24 converts the differential signal presented at its input to a single ended output of desired amplitude. The sine wave output of amplifier 24 is sent to one input of comparator 26. The other input of comparator 26 is a fixed convenient reference voltage V ref 30. The absolute value of voltage reference 30 does not enter into the determination of the impedance and thus its value is not critical and it does not require a long term stability. The output of comparator 26 is a rectangular wave the transition of which from one state to the other state occurs when the sine wave applied to one comparator input crosses the voltage level defined by voltage reference 30 at the other comparator input 28.

Accordingly, the output of comparator 26 is connected to one input of an exclusive OR gate 32 the function of which is to selectively reverse the polarity of the incoming signal or to transmit the signal unchanged. The selection for reversing polarity or transmitting the signal unchanged is made by the microprocessor by setting the logic level at the second input 36 of gate 32 by switch 38. The need for the polarity reversing is to enable subsequent time measurements to be made with respect to both transitions of the comparator output.

The output of gate 32 is applied to the clock input 42 of D type flip-flop 40. A positive transition of the signal at the clock input 42 causes the logic level at the data input to be transferred to the Q output and simultaneously the inverse of that logic level is transferred to the $\overline{Q}$ output 46. The data input of flip-flop 40 is permanently connected to a high logic level. A reset signal the derivation of which is described below, is used to reset the flip-flop 40 to a state in which the $\overline{Q}$ output is high.

This is done at a 1 KHZ frequency which is synchronous with the measurement signal. At a later time, the $\overline{Q}$ output 46 is clocked low when a positive transition occurs at the output of exclusive OR gate 32. As described above, this will either be at the positive or the negative transition of the comparator 26 output depending on the logic level applied to gate 32 by switch 38.

It will be apparent that the signal at output $\overline{Q}$ 46 of flip-flop 40 is a pulse synchronous with the measurement signal starting at an arbitrarily defined point in time and ending when the measured signal crosses the threshold defined by voltage reference 30. The signal is used to gate the appropriate number of 8 MHZ clock signal pulses into counter 50 via gate 48. The output of counter 4 is a 1 KHZ square wave from which is obtained the 1 KHZ sine wave. This same signal is applied to a one shot 52 the output of which is used to reset flip-flop 40 and to reset counter 50.

Counter 50 is thus reset to zero by 1-shot 52, then incremented by a burst of clock pulses from gate 48. The resulting contents of counter 50 are proportional to the period of the pulse output of flip-flop 40. The contents of counter 50 are then read and stored by the microprocessor. This operation is performed 4 times for each measurement signal, once for each transition of the signal across the voltage reference 30 threshold for the unknown and also for the reference resistor.

The theory of this system can be understood by reference to FIG. 2 which shows a half period signal across the reference resistor and the simultaneous half period signal across an unknown reactive component Z. The phase shift between the two signals is indicative of the voltage relationship to be found between a series combination of a pure resistor, that is the reference resistor, and a reactive component or the unknown when an AC signal is impressed across the combination.

The four time measurements obtained as described above are represented in FIG. 2 by the intersection of the signal with the voltage reference 30 and designated T1, T2, T3 and T4. The time measurements are all referenced to a common but arbitrary point in time To. An impedance Z is composed of a resistive component R wherein the voltage is in phase with the current and a reactive component wherein the voltage is 90° out of phase with the current. This impedance relationship is usually most represented mathematically as $Z=R+jx$.

An inductive reactance is characterized by a voltage vector which leads the current vector by 90° and a capacitive reactance is characterized by a voltage vector which lags the current vector by 90°. The current vector is in phase with the voltage vector of the resistive component of the impedance and also for the reference resistor. In FIG. 2 the voltage signal across the unknown component leads the voltage signal across reference resistor and thus the reactive component of the unknown is inductive. The reactive voltage vector is zero when the current vector is maximum and thus the absolute voltage across the unknown impedance when the current vector is maximum is due solely to the resistive component. Similarly the resistive voltage vector is zero when the current vector is zero and thus the absolute voltage across the unknown impedance when the current vector is zero is due solely to the reactive component.

These voltages are represented in FIG. 2 by the amplitude of the signal at time Tx for the reactive component and Tr for the resistive component. By calculating these voltages and knowing the current through the impedance derived from the voltage across the known reference resistor, the reactive impedance and resistance may be derived as will be shown.

For the trigonometric calculations which follow, it is necessary to convert the time measurements into angular units. This conversion is obtained by dividing 360° by the number of clock pulses in a full period (in this example 8000) and multiplying all time units by this constant. This conversion is made by the microprocessor and in the following mathematical development, the time scalars are treated as angular components.

For the reference signal $$Vref = Vpkr \left( \cos\left( \frac{T2 - T1}{2} \right) \right) \tag{1}$$

Where Vpkr = the peak voltage of the reference signal $$\text{or } Vpkr = \frac{Vref}{\cos\left( \frac{T2 - T1}{2} \right)} \tag{2}$$

For the unknown signal $$Vref = Vpkz \left( \cos\left( \frac{T4 - T3}{2} \right) \right) \tag{3}$$

Where Vpkz = the peak voltage of the unknown signal $Vx$ = voltage across unknown at time $Tx$ $$= Vpkz \sin\left( \left( \frac{T1 + T2}{2} - 90 \right) - \left( \frac{T3 + T4}{2} - 90 \right) \right)$$

$$= Vpkz \sin\left( \left( \frac{(T1 + T2) - (T3 + T4)}{2} \right) \right)$$

but from (3)

$$Vpkz = \frac{Vref}{\cos\frac{(T4 - T3)}{2}}$$

Therefore $$Vx = \frac{Vref}{\cos\frac{(T4 - T3)}{2}} \cdot \sin\left( \left( \frac{T1 + T2}{2} \right) - \left( \frac{T3 + T4}{2} \right) \right) \tag{4}$$

From (2) and (4)

$$\frac{Vpkr}{Vx} = \frac{1}{\cos\frac{(T2 - T1)}{2}} \cdot \frac{\cos\frac{(T4 - T3)}{2}}{\sin\left( \frac{(T1 + T2) - (T3 + T4)}{2} \right)} \tag{5}$$

For a capacitor $$C = \frac{1}{Rstd \cdot W} \cdot \frac{Vpkr}{Vx} \tag{6}$$

Where $W = 2\pi f$ and $f = 1000$ then $W = 6283.19$. For an inductor $$L = \frac{Rstd}{W} \cdot \frac{Vx}{Vpkr} \tag{7}$$

Knowing Rstd, W and deriving Vx/Vpkr from equation (5) the reactance L or C may be calculated.

The equivalent series resistive component is obtained when the reference voltage is maximum.

$$Vr = Vpkz \cos\left( \frac{(T1 + T2) - (T3 + T4)}{2} \right) \tag{8}$$

From (2), (3) and (8)

$$\frac{Vr}{Vpkr} = \frac{\cos\frac{(T2 - T1)}{2}}{\cos\frac{(T4 - T3)}{2}} \cdot \cos\left( \frac{(T1 + T2) - (T3 + T4)}{2} \right) \tag{9}$$

Assuming the same current through $R_s$ and Rstd $$R_s = Rstd \cdot \frac{Vr}{Vpkr} \tag{10}$$

Knowing Rstd and obtaining Vr/Vpkr from equation (9) the value of the resistive component can be obtained.

Knowing the reactance and resistance of a component enables the Q or quality factor and D dissipation to be calculated.

For an inductor $$Q = \frac{WL}{R_s} \tag{11}$$

and for a Capacitor $$Q = \frac{1}{WCR_s} \tag{12}$$

$$D = \frac{1}{Q} \text{ by definition} \tag{13}$$

The equivalent parallel resistance may be calculated for a capacitor using the equation:

$$R_p = \frac{1 + D^2}{D^2} \cdot R_s \tag{14}$$

and for an inductor using the equation:

$$R_p = (1 + Q^2) \cdot R_s \tag{15}$$

An example will illustrate the method. Assuming the following four time measurements have been made:
T1 = 4500
T2 = 6000
T3 = 3100
T4 = 3900
Rref = 10 Kohm
First note that $$\frac{T1 + T2}{2}$$

is greater than $$\frac{T3 + T4}{2}$$

thus the unknown reactance is capacitive.

To convert the time measurements to angular degrees requires multiplying by 360/8000.

For equation (5) we need $$\cos\frac{(T4 - T3)}{2} = \cos\left(\frac{(3900 - 3100)}{2} \cdot \frac{360}{8000}\right) =$$

$$\cos 18 = 0.951$$

$$\cos\frac{(T2 - T1)}{2} = \cos\left(\frac{(6000 - 4500)}{2} \cdot \frac{360}{8000}\right) =$$

$$\cos 33.75 = 0.831$$

$$\sin\left(\frac{(T1 + T2) - (T3 + T4)}{2}\right) =$$

$$\sin\left(\frac{(4500 + 6000) - (3100 + 3900)}{2} \cdot \frac{360}{8000}\right) =$$

$$\sin 78.75 = 0.981$$

Therefore equation (5) becomes $$\frac{Vpkr}{Vx} = \frac{0.951}{0.831} (0.981) = 1.1666$$

Thus the value of the capacitor is $$C = \frac{1}{(10000)(2\pi)(1000)} \cdot 1.1666 =$$

$$0.0185 \cdot 10^{-6} \text{ Farad from equation 6}$$

The series resistive component is similarly obtained from equations (9) and (10)

$$\frac{Vr}{Vpkr} = \frac{0.831}{0.951} \cdot 0.195 = 0.1705 \text{ from equation 9}$$

$$R = 10000 \cdot 0.1705 = 1705 \text{ ohms from equation 10}$$

The Q of the capacitor $$\frac{1}{(2\pi)(1000)(1705)(0.0185 \cdot 10^{-6})} \text{ from equation 12}$$

$$Q = 5.04 \text{ and } D - \frac{1}{Q} = 0.198 \text{ from equation 13}.$$

What is claimed is:

1. System for automatic time-based measurement of impedance in an electrical unknown component, comprising:
   (a) generating circuit means for generating a sine wave signal of desired measurement frequency,
   (b) measurement circuit means containing an unknown impedance component and also including reference resistance means in series with said unknown component across which said sine wave signal is simultaneously applied,
   (c) comparator circuit means for receiving the signals applied across the unknown component and across the reference resistance means, said signals being amplified to said comparator circuit means such that they are not subjected to phase sensitive detection nor to analog-to-digital conversion, said comparator circuit means also including reference voltage circuit input means for establishing a reference voltage level and further including polarity reversing circuit input means so that sine wave signals applied to said reference resistance means and said unknown component cross and recross in positive going and negative going transistions the defined reference voltage level to produce detectable and measureable time defined signals,
   (d) timing circuit means for receiving signals from said generating circuit means in order to initiate four timing cycles at the same point in time, two each of which said four cycle measure lapses of time with respect to transitions of said sine wave signal across said reference voltage level for each of said unknown component and said reference resistance means to thereby enable calculations by a processor means of impedance based on said timing cycles, and to receive time defined signals from said comparator circuit means, and
   (e) processor means for reading said time lapses and for calculating impedance in said unknown component.

2. The time-based impedance measuring system according to claim 1 and in which said generator circuit means includes a crystal controlled oscillator circuit means of predetermined frequency the signal of which is applied to said sine wave generating circuit.

3. The time-based impedance measuring system according to claim 2 and in which said measurement circuit means includes selection switch means for selectively connecting said unknown component and said reference resistance means to said comparator circuit means.

4. The time-based impedance measuring system according to claim 3 and in which a differential amplifier is included between said measurement circuit means and said comparator circuit means for transmitting a sine wave measurement signal of desired amplitude to said comparator circuit means.

5. The time-based impedance measuring system according to claim 4 and in which the output signal of said comparator circuit means is a rectangular wave which said transitions to negative going or positive going states occur when said sine wave measurement signal crosses said defined reference voltage level.

6. The time-based impedance measuring system according to claim 5 and in which said polarity reversing circuit means is connected to said comparator circuit means for receiving the rectangular output signal therefrom for selectively reversing the polarity of said rectangular output signal or transmitting said output signal unchanged to said timing circuit means.

7. The time-based impedance measuring system according to claim 6 and in which reset circuit means are interconnected between said oscillator circuit means and said timing circuit means for reinitiating timing cycles after timing the transitions across said reference voltage level are completed.

* * * * *